United States Patent [19]

Taylor et al.

[11] Patent Number: 5,539,337

[45] Date of Patent: Jul. 23, 1996

[54] CLOCK NOISE FILTER FOR INTEGRATED CIRCUITS

[75] Inventors: Gregory F. Taylor, Portland; Jeffrey E. Smith, Aloha, both of Oreg.

[73] Assignee: Intel Corporation, Santa Clara, Calif.

[21] Appl. No.: 367,842

[22] Filed: Dec. 30, 1994

[51] Int. Cl.⁶ .................................................. H03K 19/00
[52] U.S. Cl. ............................... 326/94; 326/22; 327/291
[58] Field of Search ................................ 326/22–24, 94, 326/98; 327/555, 34, 291–2

[56] References Cited

U.S. PATENT DOCUMENTS

| | | | |
|---|---|---|---|
| 4,296,340 | 10/1981 | Horan | 307/550 |
| 4,562,427 | 12/1985 | Ecton | 326/94 |
| 4,620,118 | 10/1986 | Barber | 307/518 |
| 4,727,518 | 2/1988 | Madland | 365/226 |
| 4,857,868 | 8/1989 | Robb | 327/291 |
| 4,975,883 | 12/1990 | Baker et al. | 365/226 |
| 4,998,027 | 3/1991 | Mihara et al. | 307/445 |
| 5,036,221 | 7/1991 | Brucculeri | 326/94 |
| 5,059,818 | 10/1991 | Witt | 327/291 |
| 5,136,185 | 8/1992 | Fleming et al. | 307/443 |
| 5,140,680 | 8/1992 | Best | 395/325 |
| 5,148,112 | 9/1992 | Gahan | 328/110 |
| 5,184,032 | 2/1993 | Leach | 326/28 |
| 5,225,715 | 7/1993 | Mori | 327/34 |
| 5,233,617 | 8/1993 | Simmons | 326/94 |
| 5,319,678 | 6/1994 | Ho | 327/291 |

*Primary Examiner*—Edward P. Westin
*Assistant Examiner*—Andrew Sanders
*Attorney, Agent, or Firm*—Blakely, Sokoloff, Taylor & Zafman

[57] ABSTRACT

A method and apparatus for providing a clock noise filter are described. The clock noise filter uses a transparent latch which has a trigger input and a data input. The data input is coupled to receive an input clock signal to be filtered. The output of the latch is the filtered clock signal. The filtered clock signal has a logic state which corresponds to the logic state of the input clock signal when the trigger input has a first predetermined logic state, and the filtered clock signal is inhibited from changing logic state when the trigger input has a second predetermined logic state. A trigger circuit is provided which has an input coupled to the output of the latch and an output coupled to the trigger input of the latch. The trigger circuit outputs the second predetermined logic state to the trigger input of the latch for a time interval in response to a change in logic state of the filtered clock signal and outputs the first predetermined logic state after the time interval has expired. The trigger circuit uses a delay stage to provide a delayed filtered clock signal to a logic gate. The logic gate receives the filtered clock signal and the delayed filtered clock signal and outputs the first and second predetermined logic states to the trigger input of the latch, depending upon the relative logic states of the filtered clock signal and the delayed filtered clock signal.

47 Claims, 4 Drawing Sheets

5,539,337

CLOCK NOISE FILTER FOR INTEGRATED CIRCUITS

FIELD OF THE INVENTION

The present invention pertains to the field of clock signals for integrated circuits. More particularly, the present invention relates to the filtering of noise and glitches from such clock signals.

BACKGROUND OF THE INVENTION

Integrated circuits (IC's) often use clock signals to control the timing of the various functions they perform. Sometimes glitches and noise disrupt these clock signals, however, resulting in malfunction of the IC's. In a typical IC, clock signals are provided to the circuitry which uses them via an input buffer in order to provide adequate driving current for the clock signals, to isolate the receiving circuitry, and to protect the receiving circuitry against electrostatic discharge. Clock signals which are poorly driven or poorly routed on a circuit board may result in signal reflections from unterminated lines or noise from the input buffer's power supply. Such noise and/or reflections may be of sufficient magnitude or duration to improperly trigger the input buffer, resulting in erroneous generation of clock edges.

Problems caused by noise and reflections in clock signals have sometimes been addressed in the prior art by adding hysteresis to the circuitry which receives the clock signal. Use of a Schmitt trigger circuit is one common way of providing hysteresis. Hysteresis solutions may be inadequate for some applications, however, because they tend to slow down the response time of the input buffer. As the amount of hysteresis used increases, the response time of the input buffer also increases. This slowing may be critical in a system that is dependent upon clock edge rates. In addition, the amount of hysteresis that can be used becomes limited as power supply voltages are reduced. As a result, some glitches may be too large to be filtered by the provided amount of hysteresis. Hence, it is desirable to provide a clock noise filter which is not sensitive to the amplitude of noise or reflections in the input clock signal and which does not adversely affect the response time of the input buffer.

SUMMARY OF THE INVENTION

A method and apparatus for providing a clock noise filter are described. The clock noise filter comprises a latch which has a trigger input and a data input. The data input is coupled to receive an input clock signal. The output of the latch is a filtered clock signal, such that the filtered clock signal has a logic state which corresponds to the logic state of the input clock signal when the trigger input has a first predetermined logic state, and the filtered clock signal is inhibited from changing logic state when the trigger input has a second predetermined logic state.

The clock noise filter also comprises a trigger circuit which has an input coupled to the output of the latch and an output coupled to the trigger input of the latch. The trigger circuit outputs the second predetermined logic state to the trigger input of the latch during a time interval in response to a change in logic state of the filtered clock signal and outputs the first predetermined logic state after the time interval has expired.

Other features of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A clock noise filter circuit for IC's is described. In the following description, for purposes of explanation, numerous specific details are set forth in order to provide a thorough understanding of the present invention. It will be evident, however, to one skilled in the art that the present invention may be practiced without these specific details. In other instances, well-known structures and devices are shown in block diagram form in order to avoid unnecessarily obscuring the present invention.

Figure 1:
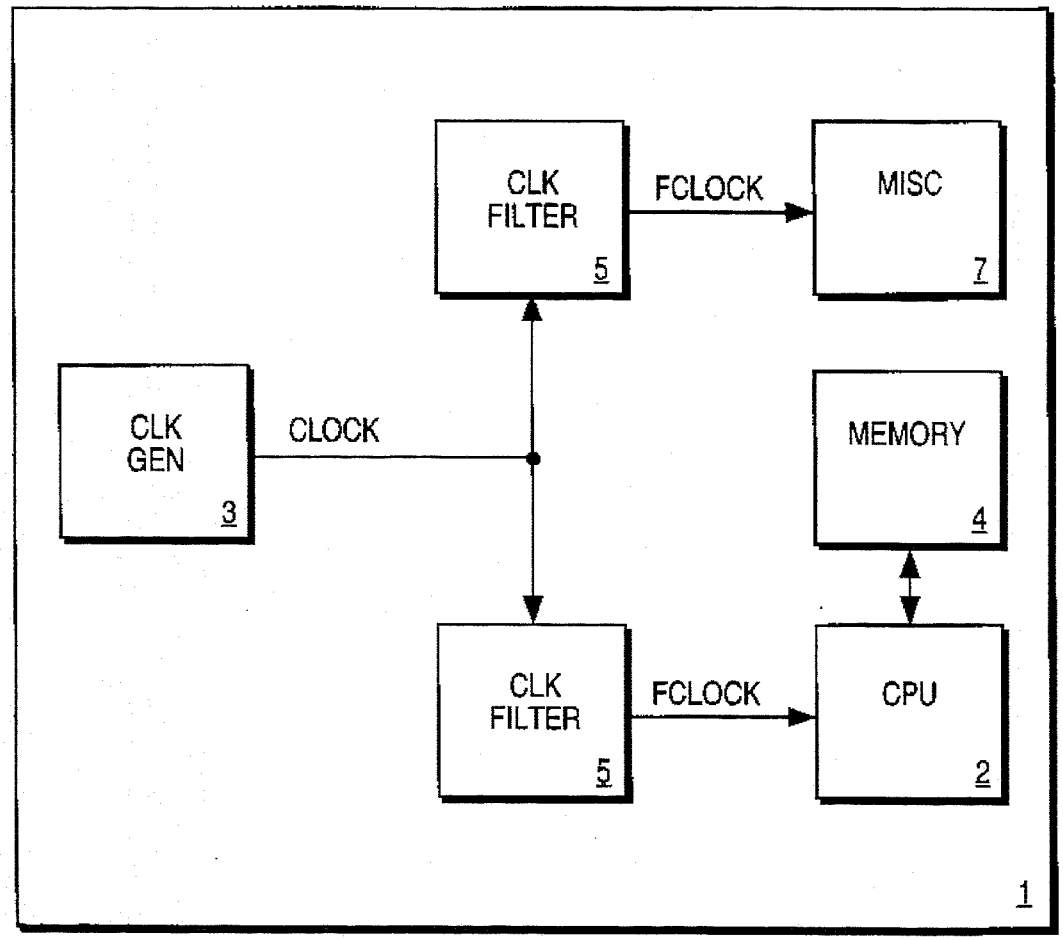
FIG. 1 is a block diagram of a computer system which uses a clock noise filter.

FIG. 1 shows a computer system 1 having a central processing unit (CPU) 2, clock generator 3, a memory 4, two clock noise filters 5, and miscellaneous circuitry 7. Although only two clock noise filters are shown in FIG. 1, the present invention may be practiced in an embodiment having as many clock noise filters 5 as are required to meet the filtering requirements of the system. Miscellaneous circuitry 7 represents any circuitry within the computer system which requires filtered clock signals. The details and specific functions of circuitry 7 are therefore not relevant for purposes of this description. Each clock noise filter 5 receives an unfiltered clock signal CLOCK from the clock generator 3. The CPU 2 and circuitry 7 both require clock signals for controlling the timing of their respective functions. Accordingly, the CPU 2 and circuitry 7 each receive a separate filtered clock signal FCLOCK from a separate one of the clock noise filters 5. The CPU 2 and circuitry 7 each comprise an input buffer for receiving the clock signal FCLOCK. The input buffer 30 of circuitry 7 is shown in FIG. 4, which is described in detail below.

Figure 2A:
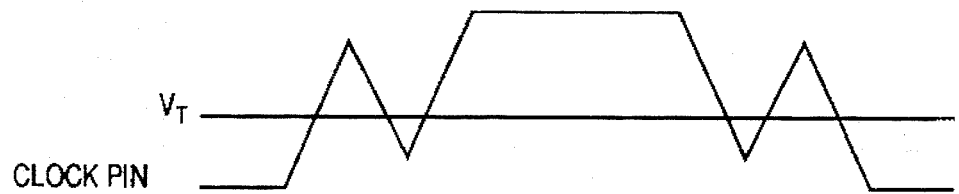
FIGS. 2A through 2C show signal transients which may cause faulty clock signals to be generated.
Figure 2B:
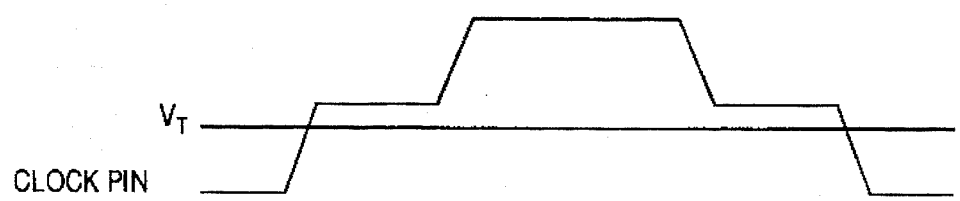
Figure 2C:
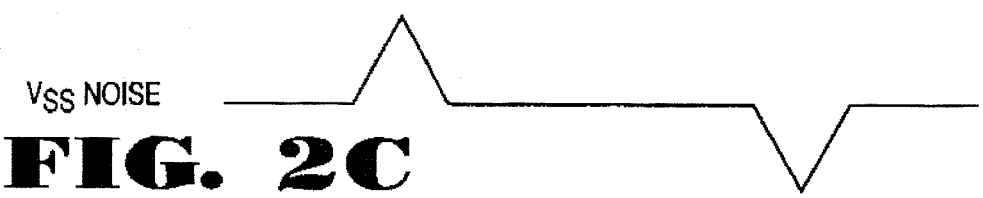

Referring to FIGS. 2A through 2C, noise and reflections may cause perturbations in the signal CLOCK. FIG. 2A shows the signal CLOCK with a severe superimposed voltage reflection. The reflection causes the voltage level of CLOCK to momentarily drop below the triggering voltage VT of the input buffer 30. FIG. 2B shows how the signal CLOCK might appear at various points along a transmission line in many complementary metal-oxide-semiconductor (CMOS) applications. In CMOS applications, it is common that only the driver end is terminated, causing a waveform similar to that of FIG. 2B to appear at most points along the transmission line. FIG. 2C shows the power supply voltage $V_{SS}$ of the input buffer 30 with superimposed noise. Noise on $V_{SS}$ causes a temporary shift down or up in the triggering voltage $V_T$ of the input buffer, depending on whether the noise is positive or negative in amplitude, respectively, with respect to $V_{SS}$.

Figure 3A:
FIGS. 3A and 3B show a clock signal before and after (respectively) filtering provided in accordance with the preferred embodiment.
Figure 3B:
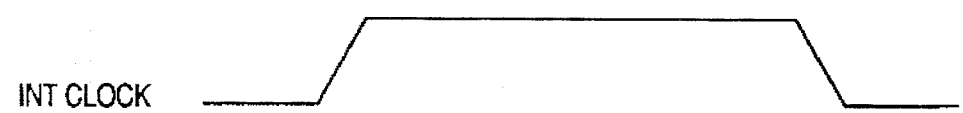

Referring now to FIGS. 3A and 3B, INT CLK is the output signal of the input buffer 30. INT CLK also represents the signal which is ultimately used by the CPU 2 or circuitry 7 for control of timing. FIG. 3A illustrates the signal INT CLOCK which would be generated if the input buffer received either the (unfiltered) signal CLOCK depicted in FIG. 2A, the (unfiltered) signal depicted in FIG. 2B combined with the $V_{SS}$ noise shown in FIG. 2C, or the (unfiltered) signal CLOCK of FIG. A combined with the $V_{SS}$ noise shown in FIG. 2C. The result is an erroneous multiple triggering of the input buffer 30, causing a faulty clock signal INT CLK to be generated, as shown in FIG. 3A. In contrast, FIG. 3B illustrates the resulting signal INT CLK when the unfiltered wave forms described above are passed through the clock noise filter 5 before being provided to the input buffer 30. The result is a clock signal INT CLK which has no unintended edges.

Figure 4:
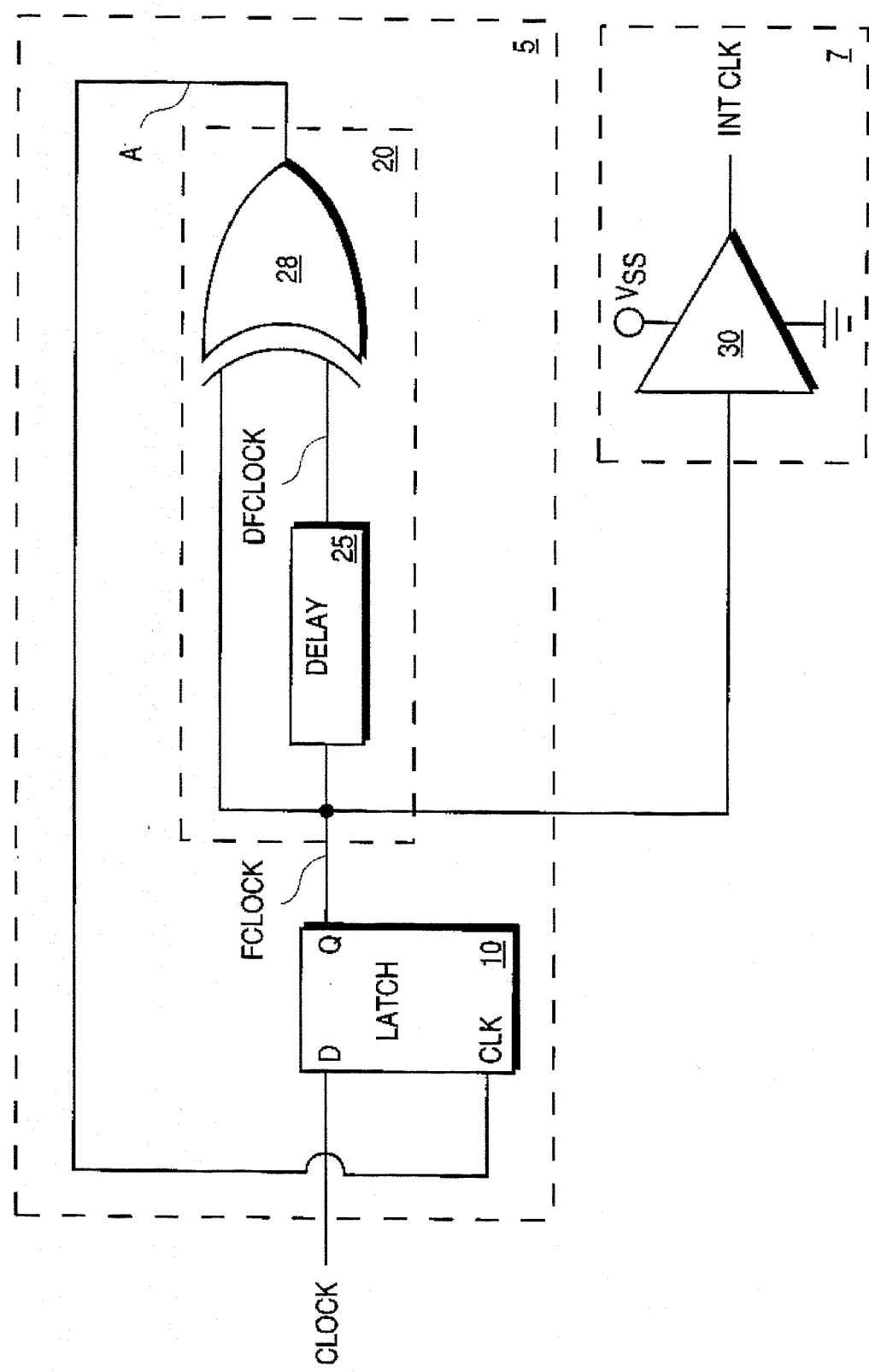
FIG. 4 shows a block diagram of a clock noise filter in accordance with the preferred embodiment.

FIG. 4 illustrates a clock noise filter 5 in greater detail. Each clock noise filter 5 comprises a transparent latch 10 and a triggering circuit 20 for controlling operation of the latch 10. The latch 10 receives at its "D" input the unfiltered signal CLOCK. The latch also receives at its CLK input the output A of the triggering circuit 20. The latch 10 outputs at its "Q" output the filtered clock signal FCLOCK, which is provided to the input of input buffer 30. The triggering circuit 20 further comprises a delay stage 25 and an exclusive OR (XOR) gate 28. The delay stage 25 receives as input the signal FCLOCK and outputs a delayed version of FCLOCK, designated DFCLOCK, to an input of the XOR gate 28. The XOR gate receives as inputs the signals FCLOCK and DFCLOCK and outputs signal A to the CLK input of the latch 10.

Each clock noise filter 5 operates by ignoring any changes in logic state of the signal CLOCK which occur during a predetermined time interval T following a transition in logic state of CLOCK which is not ignored. Specifically, when CLOCK and FCLOCK have the same logic state, signal A is a logic 0. Logic 0 applied to the CLK input of latch 10 will cause the latch to permit whatever logic state is present on signal CLOCK to propagate to its output, signal FCLOCK. When a transition occurs in the logic state of CLOCK, FCLOCK immediately changes logic state to follow CLOCK. CLOCK and FCLOCK will then have different logic states for the time T it takes for the transition of FCLOCK to propagate through the delay stage 25. While CLOCK and FCLOCK have different logic states, the output A of the XOR gate 28 is a logic 1, preventing any further transitions in logic state of CLOCK from propagating to the output FCLOCK of the latch 10. The delay stage 25, which may comprise a chain of inverters coupled in series, is selected so that the length of the time interval T is longer than the longest expected glitch but not longer than the shortest permissible normal transition of signal CLOCK. Hence, a clock noise filter which is not sensitive to the amplitude of noise or reflections in the input clock signal and which does not adversely affect the response time of the input buffer has been described.

Figure 5A:
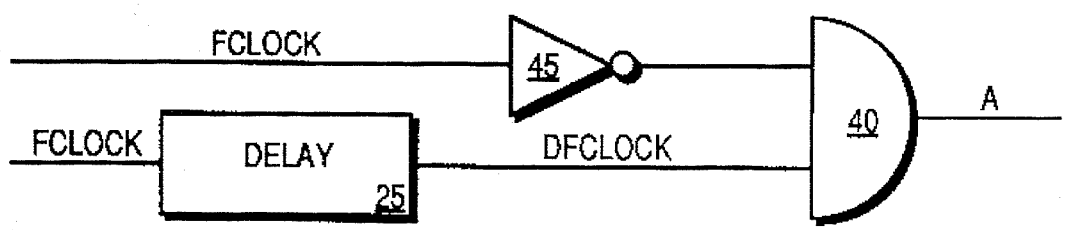
FIGS. 5A and 5B show trigger circuits in two alternative embodiments of a clock noise filter.
Figure 5B:
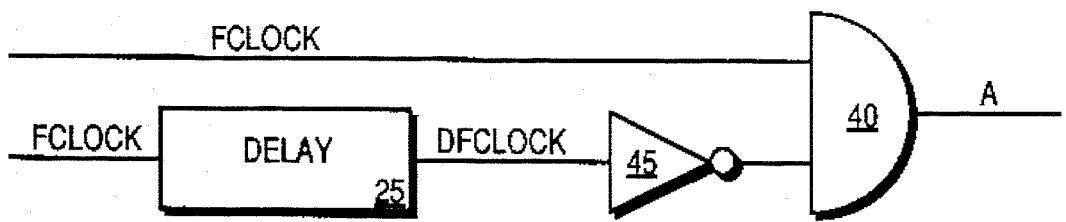

In some applications, it may be desirable to filter only the rising edges or only the falling edges of signal CLOCK. Thus, FIGS. 5A and 5B show two alternative embodiments of the clock noise filter 5 to accomplish this selective filtering in which the XOR gate 28 has been replaced with an AND gate 40 and an inverter 45. FIG. 5A shows an embodiment for filtering only the falling edges of signal CLOCK in which AND gate 40 receives as input signals DFCLOCK and $\overline{\text{FCLOCK}}$ and outputs signal A. FIG. 5B shows an embodiment for filtering only the rising edges of signal CLOCK in which the AND gate 40 receives as input signals $\overline{\text{DFCLOCK}}$ and FCLOCK and outputs signal A.

In another alternative embodiment of the clock noise filter 5, an exclusive NOR (XNOR) gate is used instead of the XOR gate 28, in conjunction with a latch having an active low $\overline{\text{CLK}}$ input. In yet another alternative embodiment, the delay stage 25 is programmable, so that the length of the delay is variable as a function of one or more factors, such as the frequency of signal CLOCK, temperature, or power supply voltage.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A clock noise filter circuit comprising:
   a latch having a trigger input and having a data input coupled to receive an input clock signal, the latch having an output for generating a filtered clock signal, the input clock signal having a clock frequency, such that the filtered clock signal has a logic state corresponding to the logic state of the input clock signal when the trigger input has a first predetermined logic state, and such that the filtered clock signal is inhibited from changing logic state when the trigger input has a second predetermined logic state; and
   a trigger circuit having an input coupled to the output of the latch and an output coupled to the trigger input of the latch, the trigger circuit outputting the second predetermined logic state during a time interval in response to a change in logic state of the filtered clock signal and outputting the first predetermined logic state after the time interval has expired.

2. The clock noise filter of claim 1, wherein the trigger circuit comprises:
   a delay stage receiving the filtered clock signal and generating a delayed filtered clock signal, wherein the delayed filtered clock signal is the filtered clock signal delayed for the time interval; and
   a logic circuit receiving the filtered clock signal and the delayed filtered clock signal, the logic circuit having an output coupled to the trigger input of the latch.

3. The clock noise filter of claim 2, wherein the logic circuit is an XOR gate.

4. The clock noise filter of claim 2, wherein the logic circuit is an XNOR gate.

5. The clock noise filter of claim 1, wherein the first predetermined logic state is logic 0 and the second predetermined logic state is logic 1.

6. The clock noise filter of claim 1, wherein the first predetermined logic state is logic 1 and the second predetermined logic state is logic 0.

7. The clock noise filter of claim 1, wherein the time interval is fixed.

8. The clock noise filter of claim 2, wherein the time interval is variable as a function of a predetermined factor.

9. The clock noise filter of claim 8, wherein the predetermined factor is the clock frequency.

10. The clock noise filter of claim 2, wherein the delay stage is programmable.

11. The clock noise filter of claim 2, wherein the logic circuit comprises:
   an inverter having an input coupled to receive the filtered clock signal; and
   an AND gate having an input coupled to receive the delayed filtered clock signal and an input coupled to the output of the inverter, the AND gate having an output coupled to the trigger input of the latch.

12. The clock noise filter of claim 2, wherein the logic circuit comprises:
   an inverter having an input coupled to receive the delayed filtered clock signal; and
   an AND gate having an input coupled to receive the filtered clock signal and an input coupled to the output of the inverter, the AND gate having an output coupled to the trigger input of the latch.

13. The clock noise filter of claim 2, wherein the logic circuit comprises:
   an inverter having an input coupled to receive the filtered clock signal; and
   a NAND gate having an input coupled to receive the delayed filtered clock signal and an input coupled to the output of the inverter, the NAND gate having an output coupled to the trigger input of the latch.

14. The clock noise filter of claim 2, wherein the logic circuit comprises:
   an inverter having an input coupled to receive the delayed filtered clock signal; and
   a NAND gate having an input coupled to receive the filtered clock signal and an input coupled to the output of the inverter, the NAND gate having an output coupled to the trigger input of the latch.

15. The clock noise filter of claim 1, wherein the latch is a transparent latch, the transparent latch allowing transitions of the logic state of the input clock signal to propagate to the output of the latch when the trigger input has the first predetermined logic state, the transparent latch preventing transitions of the logic state of the input clock signal to propagate to the output of the latch when the trigger input has the second predetermined logic state.

16. A clock noise filter circuit comprising:
   latch means for generating a filtered clock signal, the latch means receiving an input clock signal and a trigger input, such that the filtered clock signal has a logic state corresponding to the logic state of the input clock signal when the trigger input has a first predetermined logic state, and such that the filtered clock signal is inhibited from changing logic state when the trigger input has a second predetermined logic state; and
   trigger means for generating the trigger input, the trigger means further for outputting the second predetermined logic state for a time interval in response to a change in logic state of the filtered clock signal and for outputting the first predetermined logic state after the time interval has expired.

17. The clock noise filter of claim 16, wherein the trigger means comprises:
   delay means for receiving the filtered clock signal and for generating a delayed filtered clock signal, wherein the delayed filtered clock signal is the filtered clock signal delayed for the time interval; and
   logic means for receiving the filtered clock signal and the delayed filtered clock signal and for outputting the trigger input.

18. The clock noise filter of claim 17, wherein the logic means is an XOR gate means.

19. The clock noise filter of claim 17, wherein the logic means is an XNOR gate means.

20. The clock noise filter of claim 17, wherein the first predetermined logic state is logic 0 and the second predetermined logic state is logic 1.

21. The clock noise filter of claim 17, wherein the first predetermined logic state is logic 1 and the second predetermined logic state is logic 0.

22. The clock noise filter of claim 17, wherein the time interval is fixed.

23. The clock noise filter of claim 17, wherein the time interval is variable as a function of a predetermined factor.

24. The clock noise filter of claim 23, wherein the delay means is programmable such that the time interval can be programmed as a function of the predetermined factor.

25. The clock noise filter of claim 23, wherein the input clock has a clock frequency, and wherein the predetermined factor is the clock frequency.

26. The clock noise filter of claim 16, wherein the latch means comprises transparent latch means for allowing transitions of the logic state of the input clock signal to propagate to an output of the latch means when the trigger input has the first predetermined logic state, the transparent latch means further for preventing transitions of the logic state of the input clock signal to propagate to the output of the latch means when the trigger input has the second predetermined logic state.

27. A computer system having a central processing unit, a memory, a clock generator, and a clock noise filter, the clock noise filter comprising:
   a latch having a trigger input and having a data input coupled to receive an input clock signal having a clock frequency, the latch having an output for generating a filtered clock signal, such that the filtered clock signal has a logic state corresponding to the logic state of the input clock signal when the trigger input has a first predetermined logic state, and such that the filtered clock signal is inhibited from changing logic state when the trigger input has a second predetermined logic state; and
   trigger circuitry having an input coupled to the output of the latch and an output coupled to the trigger input of the latch, the trigger circuitry outputting the second predetermined logic state for a time interval in response to a change in logic state of the filtered clock signal and outputting the first predetermined logic state after the time interval has expired.

28. The computer system of claim 27, wherein the trigger circuitry comprises:
   a delay stage receiving the filtered clock signal and generating a delayed filtered clock signal, wherein the delayed filtered clock signal is the filtered clock signal delayed for the time interval; and
   a logic gate receiving the filtered clock signal and the delayed filtered clock signal, the logic gate having an output coupled to the trigger input of the latch.

29. The computer system of claim 27, wherein the logic gate is an XOR gate.

30. The computer system of claim 27, wherein the logic gate is an XNOR gate.

31. The computer system of claim 27, wherein the first predetermined logic state is logic 0 and the second predetermined logic state is logic 1.

32. The computer system of claim 27, wherein the first predetermined logic state is logic 1 and the second predetermined logic state is logic 0.

33. The clock noise filter of claim 27, wherein the time interval is fixed.

34. The clock noise filter of claim 27, wherein the time interval is variable as a function of a predetermined factor.

35. The clock noise filter of claim 34, wherein the predetermined factor is the clock frequency.

36. The clock noise filter of claim 28, wherein the delay stage is programmable.

37. The computer system of claim 27, wherein the latch is a transparent latch, the transparent latch allowing transitions of the logic state of the input clock signal to propagate to the output of the latch when the trigger input has the first predetermined logic state, the transparent latch preventing transitions of the logic state of the input clock signal to propagate to the output of the latch when the trigger input has the second predetermined logic state.

38. A processing system having a processor, a memory, a clock generator, and a clock noise filter, the clock noise filter comprising:

latch means for generating a filtered clock signal, the latch means further for receiving an input clock signal and a trigger input, such that the filtered clock signal has a logic state corresponding to the logic state of the input clock signal when the trigger input has a first predetermined logic state, and such that the filtered clock signal is inhibited from changing logic state when the trigger input has a second predetermined logic state; and trigger means for generating the trigger input, the trigger means further for outputting the second predetermined logic state for a time interval in response to a change in logic state of the filtered clock signal and for outputting the first predetermined logic state after the time interval has expired.

39. The processing system of claim 38, wherein the trigger means comprises:

delay means for receiving the filtered clock signal and for generating a delayed filtered clock signal, wherein the delayed filtered clock signal is the filtered clock signal delayed for the time interval; and logic means for receiving the filtered clock signal and the delayed filtered clock signal and for outputting the trigger input.

40. The processing system of claim 38, wherein the logic means is an XOR gate means.

41. The processing system of claim 38, wherein the logic means is an XNOR gate means.

42. The processing system of claim 38, wherein the first predetermined logic state is logic 0 and the second predetermined logic state is logic 1.

43. The processing system of claim 38, wherein the first predetermined logic state is logic 1 and the second predetermined logic state is logic 0.

44. The processing system of claim 38, wherein the latch means comprises transparent latch means for allowing transitions of the logic state of the input clock signal to propagate to an output of the latch means when the trigger input has the first predetermined logic state, the transparent latch means further for preventing transitions of the logic state of the input clock signal to propagate to the output of the latch means when the trigger input has the second predetermined logic state.

45. A method of filtering an input clock signal, the input clock signal having a logic state, the method comprising the steps of:

generating an output clock signal, such that the output clock signal has a logic state corresponding to the logic state of the input clock signal when a trigger signal has a first predetermined logic state;

inhibiting the output clock signal from changing logic state when the trigger signal has a second predetermined logic state; and generating the trigger signal, such that the trigger signal has the second predetermined logic state for a time interval in response to a change in logic state of the output clock signal and such that the trigger signal has the first predetermined logic state after the time interval has expired.

46. The method of claim 45, wherein the step of generating the trigger signal comprises the steps of:

generating a delayed version of the output clock signal, wherein the delayed version of the output clock signal is the output clock signal delayed for the time interval; and generating the trigger signal based on the delayed version of the output clock signal.

47. The method of claim 46, further comprising the step of latching the input clock signal while the output clock signal and the delayed version of the output clock signal have different logic states.

* * * * *